United States Patent
Song et al.

(10) Patent No.: US 9,859,175 B2
(45) Date of Patent: Jan. 2, 2018

(54) SUBSTRATE PROCESSING SYSTEM, METHOD OF MANAGING THE SAME AND METHOD OF MANUFACTURING SEMICONDUCTOR DEVICE WITH THE SAME

(71) Applicant: Samsung Electronics Co., Ltd., Suwon-si (KR)

(72) Inventors: Kiwook Song, Bucheon-si (KR); Bum-Soo Kim, Incheon (KR); Kye Hyun Baek, Suwon-si (KR); Masayuki Tomoyasu, Seongnam-si (KR); Eunwoo Lee, Seongnam-si (KR); Jong Seo Hong, Yongin-si (KR)

(73) Assignee: SAMSUNG ELECTRONICS CO., LTD., Samsung-ro, Yeongtong-gu, Suwon-si, Gyeongggi-do (KR)

( * ) Notice: Subject to any disclaimer, the term of this patent is extended or adjusted under 35 U.S.C. 154(b) by 0 days.

(21) Appl. No.: 15/142,275

(22) Filed: Apr. 29, 2016

(65) Prior Publication Data

US 2016/0372386 A1  Dec. 22, 2016

(30) Foreign Application Priority Data

Jun. 16, 2015  (KR) .................. 10-2015-0085212

(51) Int. Cl.
| | |
|---|---|
| *H01L 21/66* | (2006.01) |
| *G01R 31/26* | (2014.01) |
| *H01J 37/32* | (2006.01) |

(52) U.S. Cl.
CPC .......... *H01L 22/10* (2013.01); *H01J 37/3288* (2013.01); *H01J 37/32972* (2013.01)

(58) Field of Classification Search
None
See application file for complete search history.

(56) References Cited

U.S. PATENT DOCUMENTS 5,458,754 A * 10/1995 Sathrum .............. C23C 14/325
                                                                        204/192.38
6,455,437 B1    9/2002 Davidow et al.
(Continued)

FOREIGN PATENT DOCUMENTS

| KR | 10-0833646 | 5/2008 |
|---|---|---|
| WO | WO2005/054880 | 6/2005 |
| WO | WO2007/037012 | 4/2007 |

OTHER PUBLICATIONS

Xi-Ming Zhu et al., "A simple collisional-radiative model for low-temperature argon discharges with pressure ranging from 1Pa to atmospheric pressure: kinetics of Paschen 1s and p levels," Journal of Physics D: Applied Physics, J. Phys. D: Appl. Phys. 43 (2010) 015204, pp. 1-17.

*Primary Examiner* — Calvin Choi
(74) *Attorney, Agent, or Firm* — Muir Patent Law, PLLC

(57) ABSTRACT

Provided are substrate processing systems and methods of managing the same. The method may include displaying a notification for a preventive maintenance operation on a chamber, performing a maintenance operation on the chamber, performing a first optical test, and evaluating the preventive maintenance operation. The first optical test may include generating a reference plasma reaction, measuring a variation of intensity by wavelength for plasma light emitted from the reference plasma reaction, and calculating an electron density and an electron temperature from a ratio in intensity of the plasma light.

20 Claims, 12 Drawing Sheets

(56) References Cited

U.S. PATENT DOCUMENTS

| | | |
|---|---|---|
| 6,812,044 B2 | 11/2004 | Chiu et al. |
| 6,919,689 B2 | 7/2005 | Jafarian-tehrani et al. |
| 7,061,184 B2 | 6/2006 | Kim et al. |
| 7,813,895 B2 | 10/2010 | Tallavarjula et al. |
| 7,829,468 B2 | 11/2010 | Keil et al. |
| 8,101,906 B2 | 1/2012 | Tallavarjula et al. |
| 2004/0263827 A1* | 12/2004 | Xu ................. G01N 21/68 356/72 |
| 2008/0063810 A1 | 3/2008 | Park et al. |
| 2009/0112520 A1 | 4/2009 | Lymberopoulos et al. |
| 2010/0076729 A1 | 3/2010 | Davis et al. |
| 2010/0084544 A1* | 4/2010 | Tallavarjula ........... G01J 3/28 250/252.1 |
| 2013/0006555 A1* | 1/2013 | Roberg ............ H01J 37/32183 702/61 |
| 2014/0349417 A1 | 11/2014 | O'neill et al. |

\* cited by examiner

SUBSTRATE PROCESSING SYSTEM, METHOD OF MANAGING THE SAME AND METHOD OF MANUFACTURING SEMICONDUCTOR DEVICE WITH THE SAME

CROSS-REFERENCE TO RELATED APPLICATIONS

This U.S. non-provisional patent application claims priority under 35 U.S.C. §119 to Korean Patent Application No. 10-2015-0085212, filed on Jun. 16, 2015, in the Korean Intellectual Property Office, the entire contents of which are hereby incorporated by reference.

BACKGROUND

This disclosure relates to substrate processing systems and methods of managing the same. This disclosure also relates to substrate processing systems for fabricating a semiconductor device using plasma reactions and method of managing the substrate processing systems.

In general, semiconductor devices are fabricated using a plurality of unit processes, such as a thin-film deposition process, a diffusion process, a thermal treatment process, a photolithography process, a polishing process, an etching process, an ion implantation process, and a cleaning process. Some of them (e.g., the etching process) may be performed using plasma reactions. The use of plasma reactions may make it possible to improve process reliability of the etching process. However, plasma reactions may lead to contamination of the etching system. Accordingly, it is beneficial to periodically perform a preventive maintenance operation on the etching system.

SUMMARY

Example embodiments of the inventive concept provide a substrate processing system configured to evaluate results of a preventive maintenance operation through an optical method and a method of managing the system.

Other example embodiments of the inventive concept provide a substrate processing system configured to display causes resulting in failures of a preventive maintenance operation and a method of managing the system and a method of manufacturing semiconductor device with the substrate processing system.

According to example embodiments of the inventive concept, a method may include displaying a notification for a preventive maintenance operation on a chamber of a substrate processing system, performing a preventive maintenance operation on the chamber, performing a first optical test after the preventive maintenance operation is finished, determining whether the preventive maintenance operation for the chamber has been performed to achieve a predetermined condition, based on results of the first optical test, and performing a fabrication of a substrate to form a pattern or a layer with the substrate. The performing of the first optical test may include generating a plasma reaction in the chamber, measuring a variation of intensity by wavelength for plasma light emitted from the plasma reaction, and calculating an electron density and an electron temperature from a ratio in intensity of the plasma light.

According to example embodiments of the inventive concept, a substrate processing system may include a chamber, a gas supply unit configured to supply gas to the chamber, an RF power supply unit configured to supply an RF power to the chamber, and a control unit configured to control the chamber, the gas supply unit, and the RF power supply unit. The control unit may be configured to control a first optical test using a plasma reaction after a preventive maintenance operation on the chamber is finished. The first optical test may include obtaining an electron density and an electron temperature in the plasma reaction, and comparing the electron density and the electron temperature with first and second reference ranges to determine whether the preventive maintenance operation has been performed to be in compliance with a predetermined condition.

The control unit may be configured to classify each of the electron density and the electron temperature into a plurality of levels based on its magnitude when the preventive maintenance operation is determined to have been performed for the chamber to be outside of compliance with the predetermined condition, and to determine a cause resulting in a failure of the preventive maintenance operation, based on the classified level.

According to some embodiments of the present disclosure, a method of manufacturing a semiconductor device comprises displaying an indication for a preventive maintenance operation of a chamber, performing a preventive maintenance operation of the chamber, performing a first optical test after the preventive maintenance operation is finished, determining whether the preventive maintenance operation is performed for the chamber to be in compliance with a first predetermined condition, based on results of the first optical test, and performing a fabrication of a substrate to form a pattern or a layer with the substrate, wherein the performing of the first optical test comprises generating a first plasma reaction in the chamber, measuring a variation of intensity by wavelength for plasma light emitted from the first plasma reaction, and calculating a first electron density and a first electron temperature from a ratio in intensity of the plasma light of the first plasma reaction.

The method of manufacturing the semiconductor device may further comprise performing a seasoning process on the chamber when the preventive maintenance operation is determined to have been performed for the chamber to be in compliance with the first predetermined condition, performing a second optical test, after the performing the seasoning process, and determining whether the seasoning process is performed for the chamber to be in compliance with a second predetermined condition, based on results of the second optical test.

The first predetermined condition and the second predetermined condition may be substantially the same. The second optical test may comprise generating a second plasma reaction in the chamber, measuring a variation of intensity by wavelength for plasma light emitted from the second plasma reaction, and calculating a second electron density and a second electron temperature from a ratio in intensity of the plasma light of the second plasma reaction.

The method of manufacturing the semiconductor device may further comprise performing a third optical test after the performing the fabrication of the substrate, determining whether the fabrication is performed to be in compliance with a third predetermined condition, based on results of the third optical test, wherein the fabrication of the substrate may be performed when the seasoning process is determined to have been performed for the chamber to be in compliance with the second predetermined condition.

The second predetermined condition and the third predetermined condition may be substantially the same. The third optical test may comprise generating a third plasma reaction in the chamber, measuring a variation of intensity by wavelength for plasma light emitted from the third plasma reaction, and calculating a third electron density and a third electron temperature from a ratio in intensity of the plasma light of the third plasma reaction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
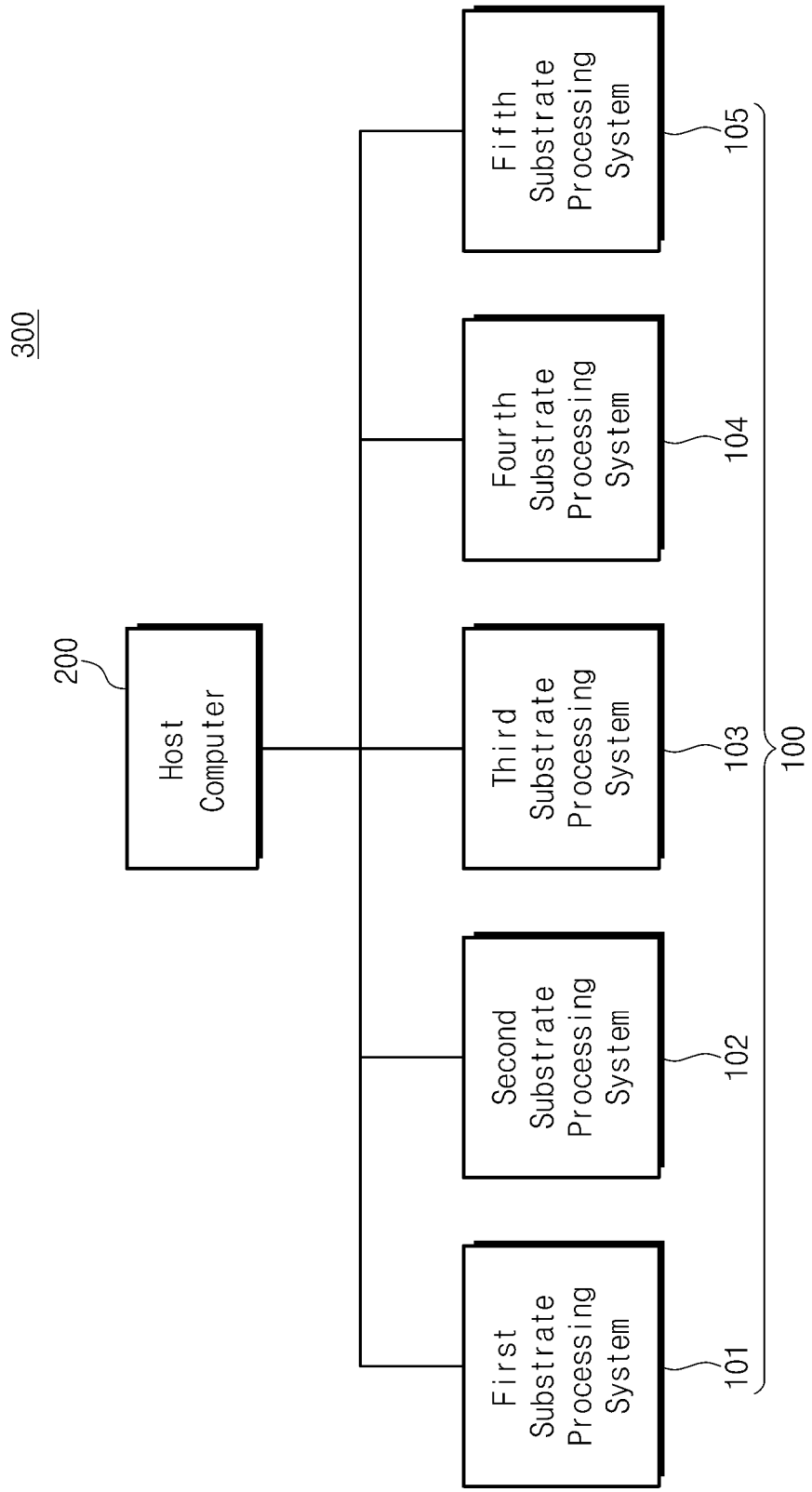
FIG. 1 is a block diagram schematically illustrating a system of fabricating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings may indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

As used herein, a semiconductor device may refer to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating a semiconductor fabricating system according to example embodiments of the inventive concept.

Referring to FIG. 1, a semiconductor fabricating system 300 may include a plurality of substrate processing systems 100 and a host computer 200. The substrate processing systems 100 may be connected to the host computer 200. The host computer 200 may control the substrate processing systems 100. The substrate processing systems 100 may be used to perform a fabrication process. For example, the substrate processing systems 100 may be used to fabricate a silicon substrate, a germanium substrate, an integrated circuit device, a semiconductor device or an electronic device. In some embodiments, the substrate processing systems 100 may include first to fifth substrate processing systems 101-105. The first to fifth substrate processing systems 101-105 may be configured to perform the same fabrication process. For example, each of the first to fifth substrate processing systems 101-105 may include a facility configured to perform an etching process. In other example embodiments, at least one of the first to fifth substrate processing systems 101-105 may be configured to include one of chemical vapor deposition, atomic layer deposition, sputtering, ion-implantation, exposure, spinner, transfer, and storage facilities.

Figure 2:
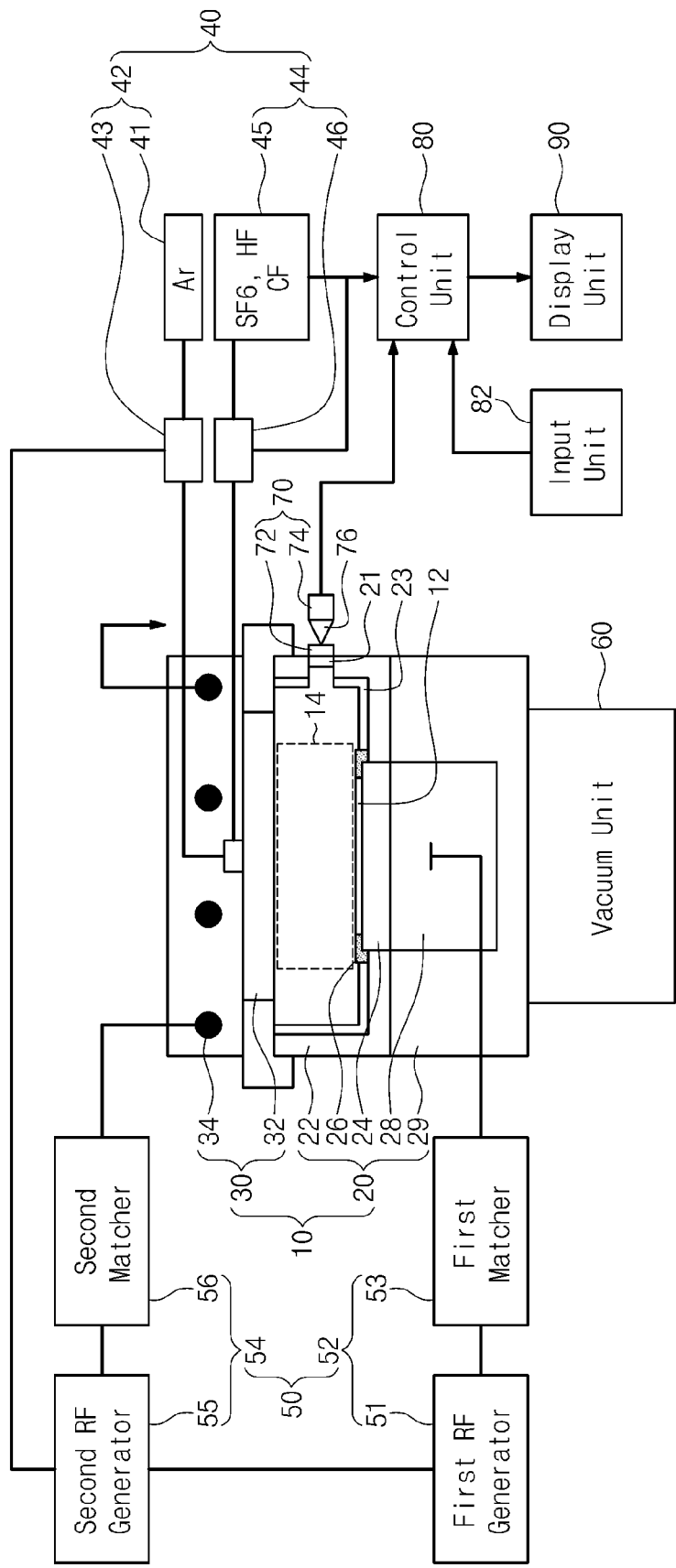
FIG. 2 is a diagram schematically illustrating an example of a first substrate processing system of FIG. 1.

FIG. 2 is a diagram schematically illustrating an example of the first substrate processing system 101 of FIG. 1.

Referring to FIG. 2, the first substrate processing system 101 may include a capacitively-coupled plasma (CCP) etching system or an inductively-coupled plasma (ICP) etching system. In some embodiments, the first substrate processing system 101 may include a chamber 10, a gas supply unit 40, a high-frequency or radio-frequency (RF) power supply unit 50, a vacuum unit 60, spectrum analyzer 70, a control unit 80, and a display unit 90. A substrate 12 may be loaded in the chamber 10. The gas supply unit 40 may be configured to supply an inactive gas and/or a reaction gas into the chamber 10. The inactive gas may be used as a plasma-inducing gas (or a reference gas). The inactive gas may include at least one of argon (Ar) gas, helium (He) gas, xenon (Xe) gas, or nitrogen ($N_2$) gas. As an example, the reaction gas may be a highly-acidic etching gas containing $SF_6$, HF, and/or $CF_4$. The RF power supply unit 50 may be configured to supply RF power to the chamber 10. The RF power may be used to induce plasma reaction 14 from the inactive gas and the reaction gas. The plasma reaction 14 may include a process plasma reaction and first to third reference plasma reactions. The process plasma reaction may be an active reaction between the reaction gas and the inactive gas. Each of the first to third reference plasma reactions may be an active reaction of the inactive gas. Hereinafter, the plasma reaction 14 will be described with reference to the process plasma reaction. The vacuum unit 60 may be configured to pump out the inactive gas and the reaction gas from the chamber 10. The spectrum analyzer 70 may be configured to detect light from the plasma reaction 14. The control unit 80 may control a fabrication process, based on optical detection signals obtained by the spectrum analyzer 70. The display unit 90 may display technical matters associated with the fabrication process.

The chamber 10 may be a plasma processing module for treating the substrate 12 with plasma. In some embodiments, the chamber 10 may include a lower housing 20 and an upper housing 30. The substrate 12 may be disposed or loaded on the lower housing 20. The upper housing 30 may be provided over the substrate 12.

The lower housing 20 may be configured to be movable in a vertical (i.e., upward or downward) direction relative to the upper housing 30. In some embodiments, the lower housing 20 may include a wall liner 22, an electrostatic chuck 24, a ring element 26, a lower electrode 28, and a supporting block 29. The wall liner 22 may be coupled to the upper housing 30. The wall liner 22 may include a view port 21 and a protection layer 23. The view port 21 may be configured to allow observation of an inner space enclosed by the wall liner 22. The view port 21 may include glass. The protection layer 23 may be disposed on an inner wall of the wall liner 22. The protection layer 23 may protect the wall liner 22 from the plasma reaction 14. The protection layer 23 may include yttrium oxide ($Y_2O_3$) or aluminum oxide ($Al_2O_3$). The electrostatic chuck 24 may be disposed in the wall liner 22. The electrostatic chuck 24 may fasten the substrate 12 using an electrostatic force. The substrate 12 may be classified into a process substrate or a bare wafer. Here, the process substrate may be a silicon wafer, on which a fabrication process will be actually performed. The bare wafer may be a silicon wafer, on which first to third optical tests or a seasoning process will be performed. Hereinafter, for the sake of simplicity, the description that follows will refer to an example of the present embodiment in which the substrate 12 is used as the process substrate. The inactive gas and the reaction gas may be supplied into a space between the substrate 12 and the upper housing 30. The ring element 26 may be disposed along an edge region of the substrate 12. Alternatively, the ring element 26 may be disposed to enclose a sidewall of the electrostatic chuck 24. The lower electrode 28 may be disposed under the electrostatic chuck 24. The supporting block 29 may support the wall liner 22 and the lower electrode 28. The supporting block 29 may be vertically moved by a lifter (not shown).

The upper housing 30 may be disposed on the lower housing 20. In some embodiments, the upper housing 30 may include a shower head 32 and an upper electrode 34. The shower head 32 may be disposed over the substrate 12 and the electrostatic chuck 24. The shower head 32 may be used to supply the reaction gas on the substrate 12. The upper electrode 34 may be disposed on the shower head 32. The upper electrode 34 may induce plasma reaction of the reaction gas using RF power.

The gas supply unit 40 may be connected to the upper housing 30. In some embodiments, the gas supply unit 40 may include an inactive gas supply unit 42 and a reaction gas supply unit 44. The inactive gas supply unit 42 may supply an inactive gas into the chamber 10. The reaction gas supply unit 44 may supply a reaction gas into the chamber 10. The inactive gas supply unit 42 may include an inactive gas tank 41 and a first mass-flow control valve 43. The first mass-flow control valve 43 may be provided on a line, for example, a pipe, connecting the inactive gas tank 41 to the shower head 32. The first mass-flow control valve 43 may be used to control a flow rate or amount of the inactive gas. The reaction gas supply unit 44 may include a reaction gas tank 45 and a second mass-flow control valve 46. The second mass-flow control valve 46 may be provided on a line, for example, a pipe, connecting the reaction gas tank 45 to the shower head 32. The second mass-flow control valve 46 may be used to control a flow rate or amount of the reaction gas.

The RF power supply unit 50 may supply the RF power to the lower electrode 28 and the upper electrode 34. In some embodiments, the RF power supply unit 50 may include a first RF power supply unit 52 and a second RF power supply unit 54. The first RF power supply unit 52 may be connected to the lower electrode 28. The second RF power supply unit 54 may be connected to the upper electrode 34. For example, the first RF power supply unit 52 may include a first RF generator 51 and a first matcher 53. The first RF generator 51 may be configured to generate a first RF power. The first matcher 53 may be provided between the first RF generator 51 and the lower electrode 28. The first matcher 53 may be used for impedance matching of the first RF power. The second RF power supply unit 54 may include a second RF generator 55 and a second matcher 56. The second RF generator 55 may be configured to generate a second RF power. The second matcher 56 may be provided between the second RF generator 55 and the upper electrode 34. The second matcher 56 may be used for impedance matching of the second RF power.

The vacuum unit 60 may be disposed below the lower housing 20. The vacuum unit 60 may be used to exhaust a post-reaction gas from a space between the lower and upper housings 20 and 30. For example, the vacuum unit 60 may include a vacuum pump.

The spectrum analyzer 70 may be disposed adjacent to the view port 21. The spectrum analyzer 70 may be configured to measure optical characteristics of plasma light generated in the plasma reaction 14 with various wavelengths. For example, the spectrum analyzer 70 may include a spectroscope 72 and a photodetector 74. The spectroscope 72 may be disposed on the view port 21. The spectroscope 72 may be used to generate a spectrum 76 from the plasma light generated in the plasma reaction 14. The photodetector 74 may be disposed adjacent to the spectroscope 72. The spectrum 76 may be detected by the photodetector 74. The photodetector 74 may be configured to measure intensities of the plasma light in order of wavelength. For example, the photodetector 74 may include a light-detection sensor (e.g., CMOS or CCD). The photodetector 74 may be connected to the control unit 80.

The control unit 80 may receive a detection signal detected by the spectrum analyzer 70. The control unit 80 may monitor the plasma reaction 14, based on the detection signal. For example, the control unit 80 may obtain a variation of intensity by wavelength of the plasma light generated by the plasma reaction 14. An input unit 82 may be used to transmit external control values from the outside, to the control unit 80. The control unit 80 may control the gas supply unit 40, the RF power supply unit 50, and the vacuum unit 60. The external control values may include gas-supply control values, RF control values, and vacuum control values. The control unit 80 will be described in more detail with reference to a method of managing the first substrate processing system 101.

The display unit 90 may be connected to the control unit 80. The display unit 90 may display information on a variation of intensity by wavelength of the plasma light generated by the plasma reaction 14. The control values for the gas supply unit 40, the RF power supply unit 50 and the vacuum unit 60 may be displayed on the display unit 90.

Hereinafter, a method of managing the first substrate processing system 101, according to example embodiments of the inventive concept, will be described. The second to fifth substrate processing system 102-105 may be managed in the same manner as or a similar manner to the method of managing the first substrate processing system 101.

Figure 3:
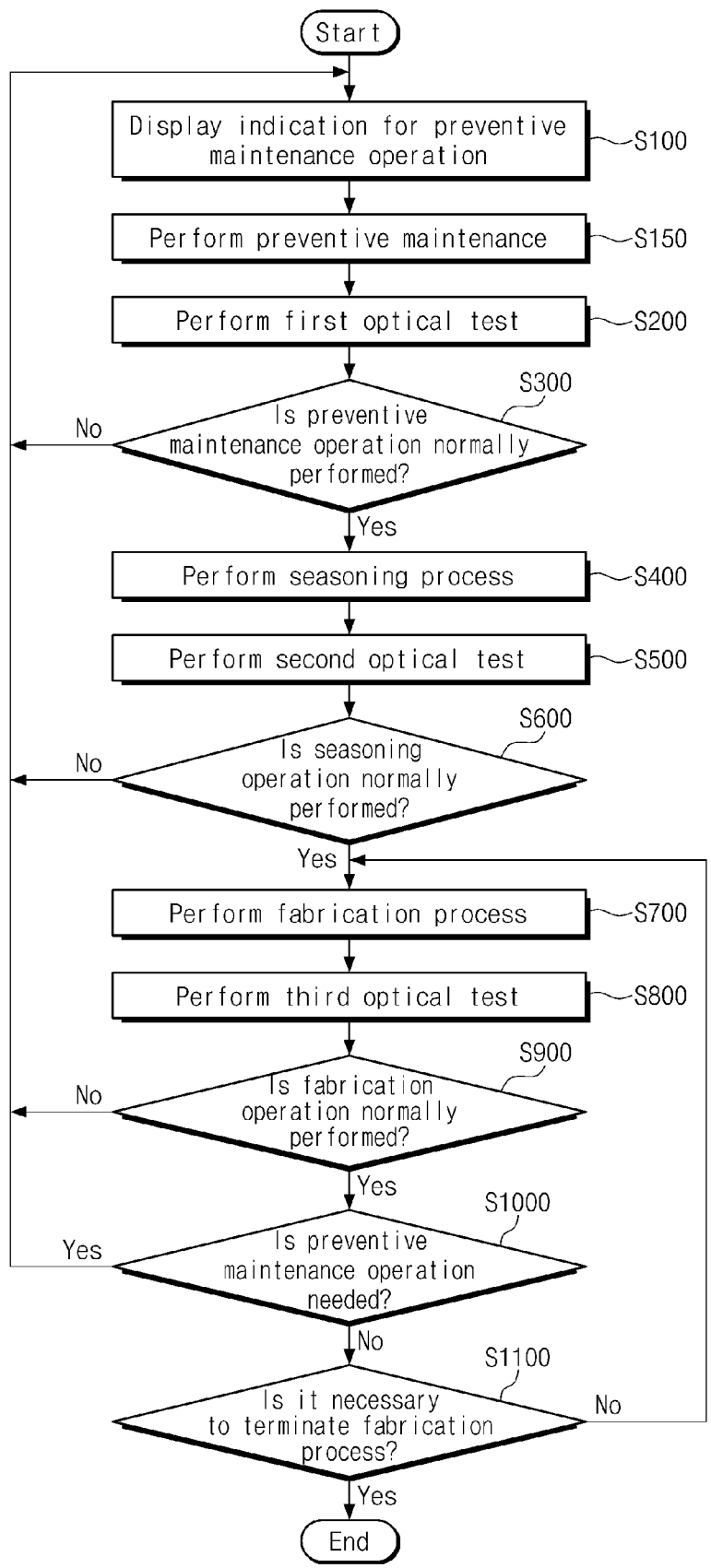
FIG. 3 is a flow chart illustrating an example of a method of managing the first substrate processing system of FIG. 2.

FIG. 3 is a flow chart illustrating an example of a method of managing the first substrate processing system 101 of FIG. 2.

Referring to FIG. 3, when there is a need for performing a preventive maintenance operation on the chamber 10, the control unit 80 may display an indicator that indicates such a need or desire for the preventive maintenance operation, on the display unit 90 (S100). For example, a notification may be issued and displayed to indicate it is time for a preventive maintenance operation. The preventive maintenance operation may include a wet cleaning operation on the chamber 10. The chamber 10, the gas supply unit 40, the RF power supply unit 50, the vacuum unit 60, the spectrum analyzer 70, the control unit 80, and the display unit 90 may be disassembled by an operator.

Figure 4:
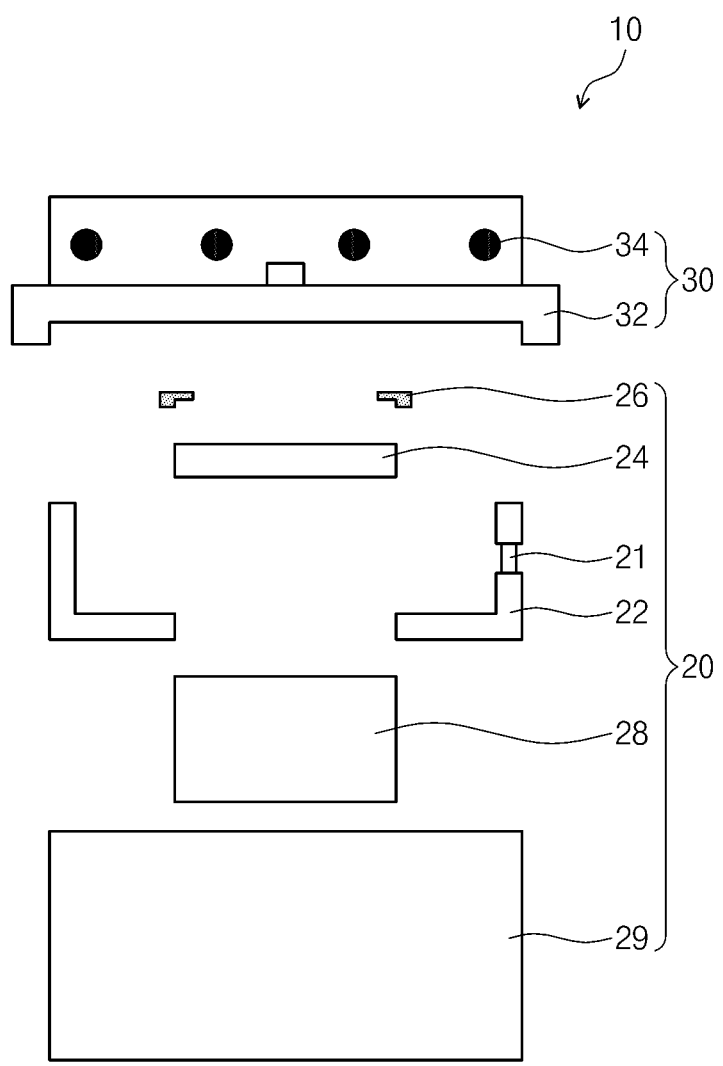
FIG. 4 is an exploded sectional view of the chamber shown in FIG. 2.

FIG. 4 is an exploded sectional view of the chamber 10 shown in FIG. 2.

Referring to FIG. 4, the disassembled parts of the chamber 10 may be cleaned in a wet manner by the operator. For example, the shower head 32 and the upper electrode 34 may be detached from the wall liner 22. The wall liner 22, the electrostatic chuck 24, the ring element 26, the lower electrode 28, and the supporting block 29 may be separated from each other. Each of the shower head 32, the wall liner 22, the lower electrode 28, and the supporting block 29 may be cleaned in a wet manner. In some embodiments, if the protection layer 23 is damaged, a coating operation may be performed to replace the protection layer 23 with a new protection layer. The electrostatic chuck 24 or the ring elements may be replaced with new ones, if the service life of these components is exceeded or approaching being exceeded. After the wet cleaning operation, the chamber 10 may be assembled, as shown in FIG. 2. For example, the chamber 10, the gas supply unit 40, the RF power supply unit 50, the vacuum unit 60, the spectrum analyzer 70, the control unit 80, and the display unit 90 may be coupled to each other. After the preventive maintenance operation, a bare wafer may be loaded on the electrostatic chuck 24. Information on the completion of the preventive maintenance operation may be input via the input unit 82.

Referring back to FIG. 3, the control unit 80 may perform a first optical test (S200). In the first optical test S200, the results of the preventive maintenance operation may be examined using an optical method.

Figure 5:
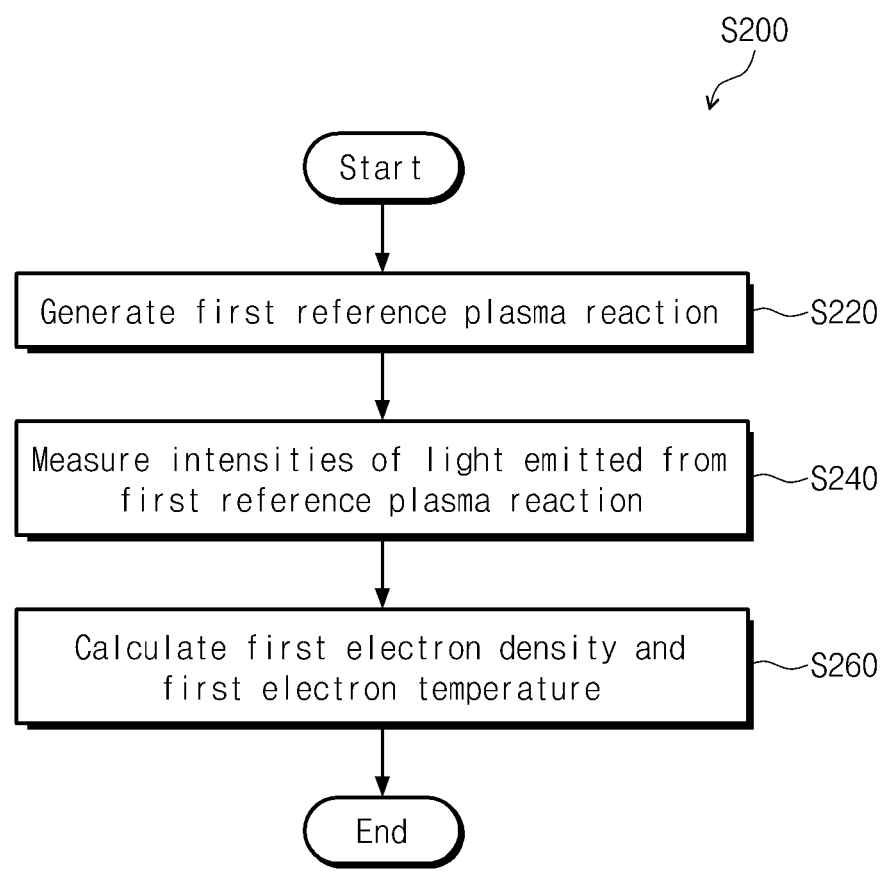
FIG. 5 is a flow chart illustrating an example of the first optical test of FIG. 3.

FIG. 5 is a flow chart illustrating an example of the first optical test S200 of FIG. 3.

Referring to FIG. 5, the first optical test S200 may include generating a first reference plasma reaction (S220), measuring intensities of light emitted from the first reference plasma reaction (S240), and calculating a first electron density and a first electron temperature (S260).

The first reference plasma reaction S220 may be induced using the inactive gas, without a reaction gas. This is because the presence of a reaction gas may result in optical noise in the first reference plasma reaction. The plasma reaction 14 in an actual fabrication process may be different from the first reference plasma reaction S220 in the first optical test S200. In the case of the plasma reaction 14 using the reaction gas, light emitted from the plasma reaction 14 may have generally white color. In the case where an argon gas is used as the inactive gas, light emitted from the first reference plasma reaction may have red color.

The spectrum analyzer 70 may be configured to detect light emitted from the first reference plasma reaction. In the first reference plasma reaction, the detected light may be emitted from the argon gas. In some embodiments, the detected light with a plurality of wavelengths may be generated in the first reference plasma reaction. The detected light may be generated by the transition of electrons from an orbital 2p to an orbital 1s of argon atoms. The orbital 2p of the argon may have 10 energy states. The orbital is of the argon may have 4 energy states. Theoretically, wavelengths of the detected light may be up to 40 types. In plasma reaction, argon may be measured to have about 10 to 20 wavelengths.

Figure 6:
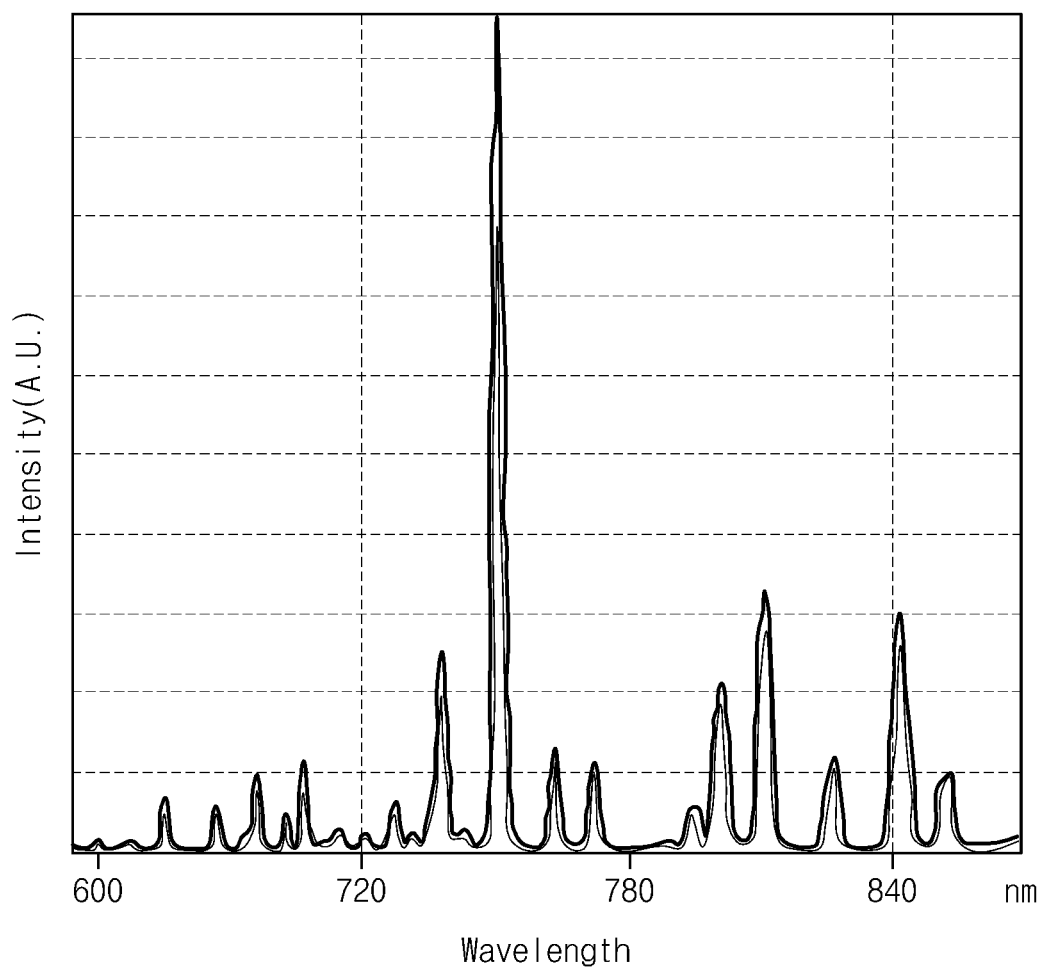
FIG. 6 is a graph showing intensity versus wavelength for light emitted from argon gas.

FIG. 6 is a graph showing intensity versus wavelength for light emitted from argon gas. Here, the horizontal axis represents wavelengths of the emitted light and the vertical axis represents intensities of the emitted light.

Referring to FIG. 6, light emitted from the argon gas may have wavelengths of 750.4 nm, 667.7 nm, 826.5 nm, 772.4 nm, 727.3 nm, 696.5 nm, 840.8 nm, 738.4 nm, 706.7 nm, 852.1 nm, 794.8 nm, 751.5 nm, 800.6 nm, 763.5 nm, 810.4 nm, 842.5 nm, 801.5 nm, and 811.5 nm. The light emitted from the argon gas may have a variation in intensity, depending on its wavelength.

Referring back to FIG. 5, the control unit 80 may obtain information on a variation of intensity by wavelength of the light emitted from the first reference plasma reaction (S240). For example, the light emitted from the first reference plasma reaction may have an intensity varying depending on the first and second RF powers. Here, information on the first reference plasma reaction may be contained in the variation in intensity of the light that is emitted from the first reference plasma reaction. The information on the first reference plasma reaction may be associated with an internal state of the chamber 10. As an example, the information on the first reference plasma reaction may correspond to the results of the preventive maintenance operation performed on the chamber 10. The results of the preventive maintenance operation performed on the chamber 10 may be represented by an intensity ratio of the light emitted from the first reference plasma reaction (i.e., $I_m/I_n$). Here, each of m and n is an integer and indicates a corresponding one of the wavelengths of the light emitted from the first reference plasma reaction. The intensity ratio, may be a state variable that is independent of the RF power.

The control unit 80 may calculate the first electron density and the first electron temperature from the intensity ratio of the light emitted from the first reference plasma reaction (S260). In some embodiments, the first electron density and the first electron temperature may be calculated by a collisional-radiative module (CRM). The CRM may be a method of calculating the first electron density and an electron module from the intensity ratio of the light emitted from the first reference plasma reaction. For example, the first electron density and the first electron temperature may be calculated by a method described in the disclosure of the paper entitled "A simple collisional-radiative model for low-temperature argon discharges with pressure ranging from 1 Pa to atmospheric pressure: kinetics of Paschen 1s and 2P levels" (Xi-Ming Zhu and Yi-Kang Pu 2010 J. Phys. D: Appl. Phys. 43 015204), the contents of which are incorporated herein in their entirety by reference.

Referring back to FIG. 3, the control unit 80 may analyze the results of the preventive maintenance operation (S300). Such an analysis of the preventive maintenance operation may include determining whether the preventive maintenance operation is properly or improperly performed. The analysis of the preventive maintenance operation (S300) may be performed based on the calculated values for the first electron density and the first electron temperature. For example, when a preventive maintenance operation is performed in a manner that complies with a predetermined standard or achieves a predetermined result designated as passing, the preventive maintenance operation may be referred to as being properly performed. On the contrary, when a preventive maintenance operation is performed in a manner that does not comply with the predetermined standard or does not achieve a predetermined result designated as passing, the preventive maintenance operation may be referred to as being improperly performed. Other words to refer to these concepts are in compliance versus not in compliance, or achieving desired results versus failing to achieve the desired results, or performing an operation to achieve a predetermined condition or set of conditions versus performing an operation and failing to achieving the predetermined condition or set of conditions.

Figure 7:
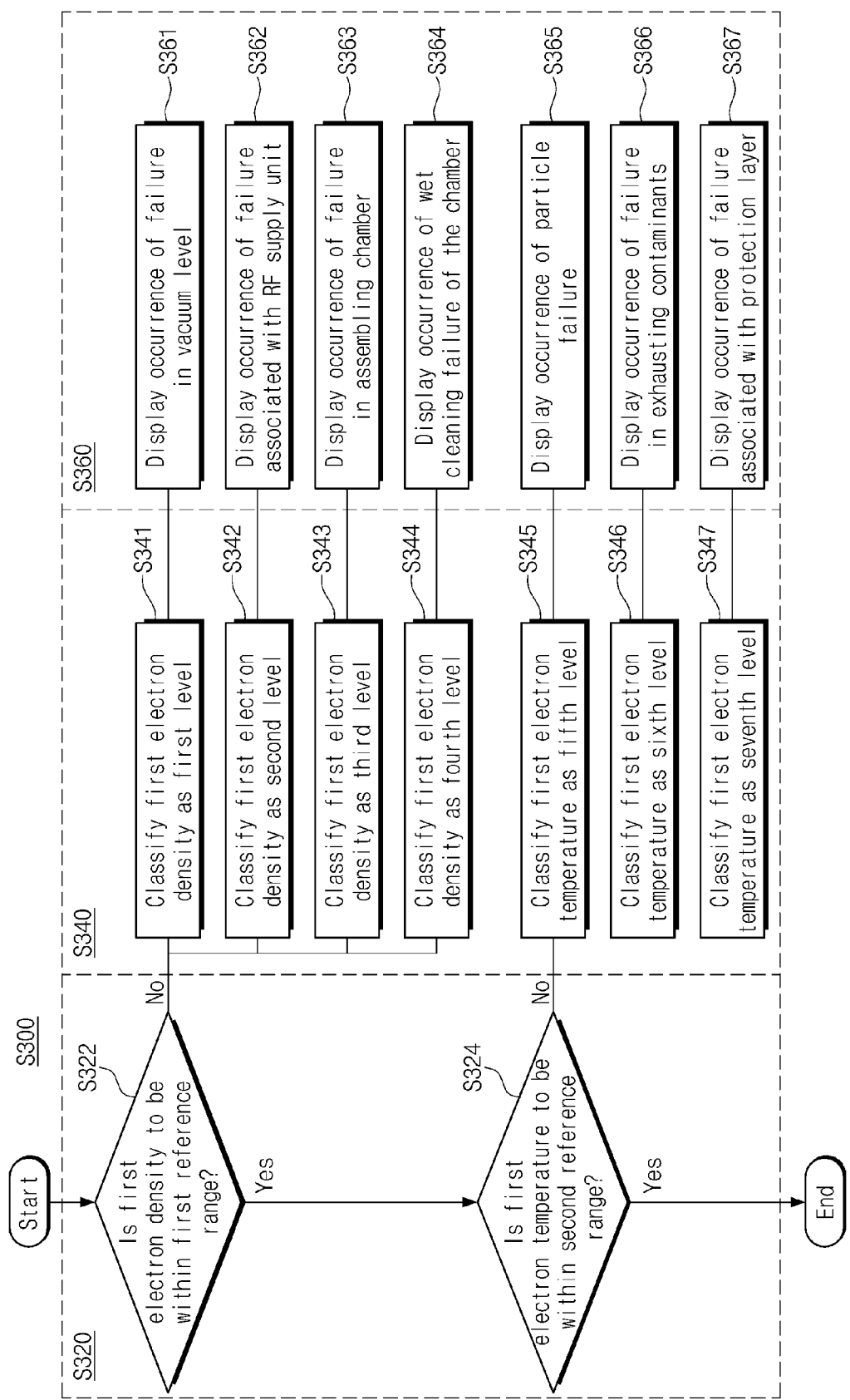
FIG. 7 is a flow chart illustrating an example of a process of evaluating a preventive maintenance operation of FIG. 3.

FIG. 7 is a flow chart illustrating an example of a process of evaluating the preventive maintenance operation S300 of FIG. 3.

Referring to FIG. 7, the analysis of the preventive maintenance operation (S300) may include comparing the first electron density and the first electron temperature with first and second reference ranges (S320) (for example, see 110 and 120 of FIGS. 8 and 9), classifying the first electron density and the first electron temperature (S340), and showing possible causes resulting in failures of the preventive maintenance operation (S360).

In the control unit 80, the first electron density and the first electron temperature may be respectively compared with the first and second reference ranges 110 and 120 (S320) to determine whether the preventive maintenance operation is properly or improperly performed. In some embodiments, the step S320 of comparing the first electron density and the first electron temperature with the first and second reference ranges 110 and 120 may include comparing the first electron density with the first reference range 110 (S322) and comparing the first electron temperature with the second reference range 120 (S324). The first and second reference ranges 110 and 120 may be empirically obtained. The first electron density may be compared with the first reference range 110 (S322). For example, if the first electron density is within the first reference range 110, the preventive maintenance operation may be determined to have been properly performed. The first electron temperature may be compared with the second reference range 120 (S324). If the first electron temperature is within the second reference range 120, the preventive maintenance operation may be determined to have been properly performed.

Figure 8:
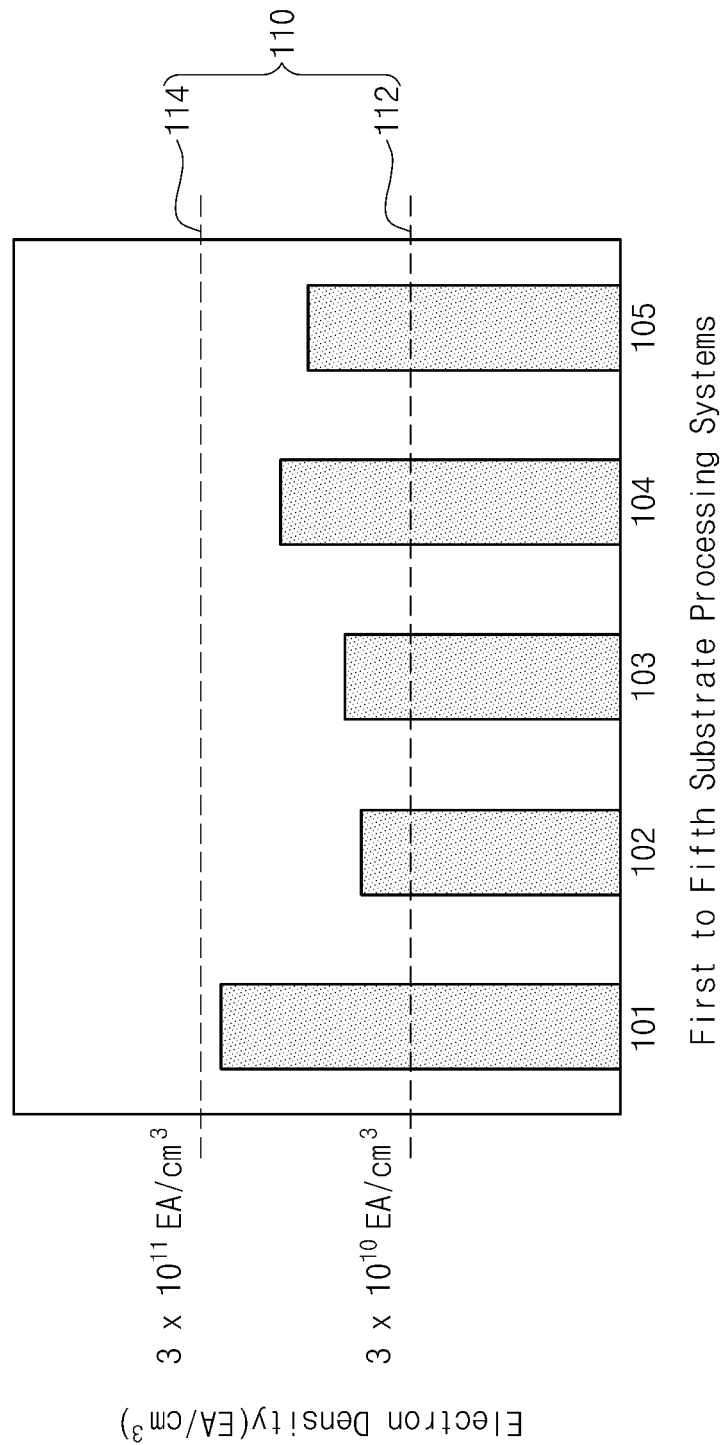
FIG. 8 is a graph showing first electron densities of chambers in the first to fifth substrate processing systems of FIG. 1.

FIG. 8 is a graph showing first electron densities of the chambers 10 in the first to fifth substrate processing systems 101-105 of FIG. 1.

Referring to FIG. 8, the first reference range 110 may have a first lower limit 112 and a first upper limit 114. In some embodiments, the first lower limit 112 may be about $3 \times 10^{10}$ EA/cm$^3$. The first upper limit 114 may be about $3 \times 10^{11}$ EA/cm$^3$. For example, the first reference range 110 may range from about $3 \times 10^{10}$ EA/cm$^3$ to about $3 \times 10^{11}$ EA/cm$^3$. For each of the first to fifth substrate processing systems 101-105, if the first electron density ranges from the first lower limit 112 to the first upper limit 114, the preventive maintenance operation may be determined to have been properly performed. By contrast, if the first electron density is beyond the range specified by the first lower limit 112 and the first upper limit 114, the preventive maintenance operation may be determined to have been improperly performed.

Figure 9:
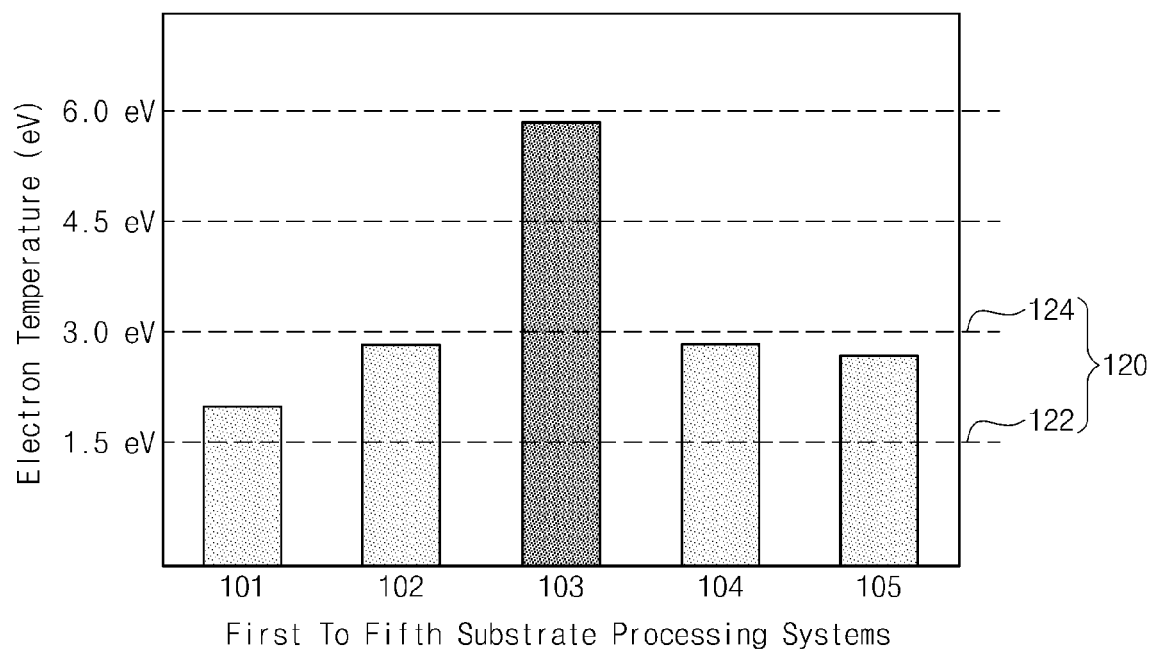
FIG. 9 is a graph showing first electron temperatures of chambers in the first to fifth substrate processing systems of FIG. 1.

FIG. 9 is a graph showing first electron temperatures of the chambers 10 in the first to fifth substrate processing systems 101-105 of FIG. 1.

Referring to FIG. 9, the second reference range 120 may have a second lower limit 122 and a second upper limit 124. In some embodiments, the second lower limit 122 may be about 1.5 eV. The second upper limit 124 may be about 3 eV. The second reference range 120 may range from 1.5 eV to 3 eV. For the chamber 10 of each of the first, second, fourth, and fifth substrate processing systems 101, 102, 104, and 105, if the first electron temperature is within the range specified by the second lower limit 122 and the second upper limit 124, the preventive maintenance operation on the chamber 10 may be determined to have been properly performed. By contrast, in the case where the chamber 10 of at least one of the substrate processing systems (e.g., the third substrate processing system 103) has a first electron density higher than the second upper limit 124, the preventive maintenance operation on the third substrate processing system 103 may be determined to have been improperly performed.

Referring back to FIG. 7, if the preventive maintenance operation is determined to have been improperly performed, the control unit 80 may classify each of the first electron density and the first electron temperature into a plurality of levels based on its magnitude (S340). For example, the control unit 80 may classify the first electron density into first to fourth levels (S341-S344). The control unit 80 may classify the first electron temperature into fifth to seventh levels (S345-S347).

Figure 10:
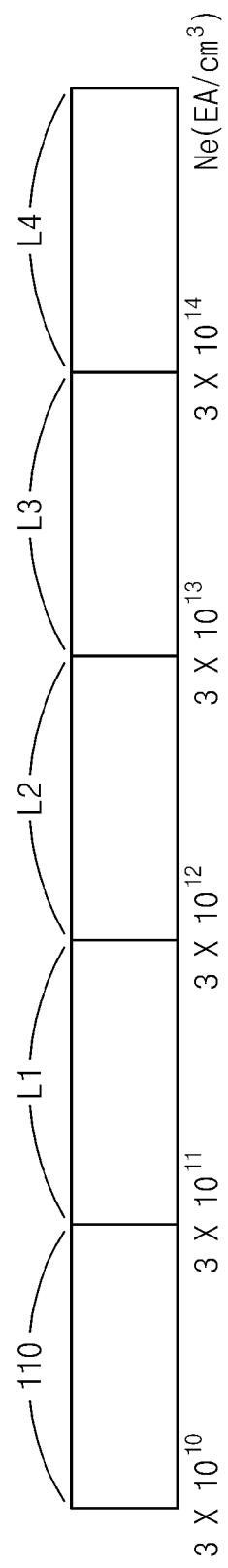
FIG. 10 is a diagram exemplarily showing first to fourth levels of the first electron density.

FIG. 10 is a diagram exemplarily showing first to fourth levels L1-L4 of the first electron density.

Referring to FIG. 10, the first to fourth levels L1-L4 of the first electron density may increase in the order of level number. The first to fourth levels L1-L4 of the first electron density may be higher than the first reference range 110. For example, the first level L1 of the first electron density may range from about $3 \times 10^{11}$ EA/cm$^3$ to about $3 \times 10^{12}$ EA/cm$^3$. The second level L2 of the first electron density may range from about $3 \times 10^{12}$ EA/cm$^3$ to about $3 \times 10^{13}$ EA/cm$^3$. The third level L3 of the first electron density may range from about $3 \times 10^{13}$ EA/cm$^3$ to about $3 \times 10^{14}$ EA/cm$^3$. The fourth level L4 of the first electron density may be higher than $3 \times 10^{14}$ EA/cm$^3$. In certain embodiments, the first to fourth level L1-L4 of the first electron density may be lower than the first reference range 110. Information on the first to fourth levels L1-L4 may be contained in a database (not shown) of the control unit 80.

Figure 11:
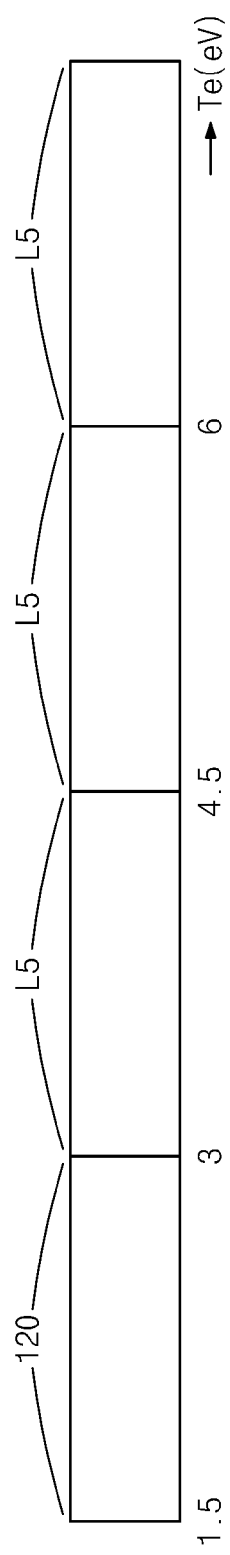
FIG. 11 is a diagram exemplarily showing fifth to seventh levels of the first electron temperature.

FIG. 11 is a diagram exemplarily showing fifth to seventh levels L5-L7 of the first electron temperature.

Referring to FIG. 11, the fifth to seventh levels L5-L7 of the first electron temperature may increase in the order of level number. The fifth to seventh levels L5-L7 of the first electron temperature may be higher than the second reference range 120. The fifth level L5 of the first electron temperature may range from about 3 eV to about 4.5 eV. The sixth level L6 of the first electron temperature may range from about 4.5 eV to about 6 eV. The seventh level L7 of the first electron temperature may be higher than 6 eV. In certain embodiments, the fifth to seventh levels L5-L7 may be lower than the second reference range 120. Information on the fifth to seventh levels L5-L7 may be contained in the database of the control unit 80.

Referring back to FIG. 7, the control unit 80 may examine a cause of the failure, which occurs in the preventive maintenance operation, based on a relationship between the first to seventh levels L1-L7 and their relevant failure causes, and may display the examined failure cause on the display unit 90 (S360). In some embodiments, the relationship between the first to seventh levels L1-L7 and the relevant failure causes may be empirically obtained. Based on the displayed failure cause, the preventive maintenance operation may again be performed on the chamber 10. In some embodiments, the displaying of the failure cause (S360) may include displaying occurrence of a failure in vacuum level of the chamber 10 (S361), displaying occurrence of a failure associated with the RF power supply unit 50 (S362), displaying occurrence of an assembly failure of the chamber 10 (S363), displaying occurrence of a wet cleaning failure of the chamber 10 (S364), displaying occurrence of a particle failure (S365), displaying occurrence of failure in exhausting contamination (S366), and displaying occurrence of a failure associated with the protection layer 23 (S367).

For example, in the case that the first electron density is classified as the first level L1, the control unit 80 may display occurrence of a failure in vacuum level of the chamber 10 on the display unit 90 (S361). In this case, the vacuum unit 60 and the gas supply unit 40 may be examined by the operator.

In the case that the first electron density is classified as the second level L2, the control unit 80 may display occurrence of a failure associated with the RF power supply unit 50 on the display unit 90 (S362). The first and second RF powers of the RF power supply unit 50 may be examined by the operator.

In the case that the first electron density is classified as the third level L3, the control unit 80 may display occurrence of a failure in assembling the chamber 10 on the display unit 90 (S363). The chamber 10 may be dissembled and re-assembled by the operator.

In the case that the first electron density is classified as the fourth level L4, the control unit 80 may display occurrence of a failure in performing the wet cleaning process on the chamber 10 on the display unit 90 (S364). The operator may perform a wet cleaning operation on the chamber 10.

In the case that the first electron temperature is classified as the fifth level L5, the control unit 80 may display occurrence of particle contamination on an inner wall of the chamber 10 on the display unit 90 (S365). The operator may examine and settle the cause of the particle contamination and perform a wet cleaning operation on the chamber 10.

In the case that the first electron temperature is classified as the sixth level L6, the control unit 80 may display occurrence of a failure in exhausting contaminants from the chamber 10 on the display unit 90 (S366). The operator may examine the chamber 10 and the vacuum unit 60 and settle the cause of such an exhausting failure. In certain embodiments, a wet cleaning operation may also be performed on the chamber 10.

In the case that the first electron temperature is classified as the seventh level L7, the control unit 80 may display the occurrence of the damage or contamination of the protection layer 23 on the display unit 90 (S367). The operator may perform a process of coating the protection layer 23 on the inner wall of the wall liner 22.

In certain embodiments, two or more failure notices may be displayed on the display unit 90 according to the measurement results of the electron density and/or the electron temperature, which may signify multiple problems. In this case, an operator may check the multiple aspects of the chamber and fix the problems. In some other embodiments, the display unit 90 may display multiple check notices, which may indicate at least one of the multiple aspects has a problem. In this case, an operator may check the multiple aspects and fix the problems.

The step of displaying the failure cause of the preventive maintenance operation (S360) may correspond to the step of displaying the notification indicator for the preventive maintenance operation (S100). As a result of the displaying of the failure cause of the preventive maintenance operation (S360), it is possible to reduce a process time for the preventive maintenance operation. For example, as a result of the displaying of the failure cause of the preventive maintenance operation (S360), it is possible to improve reliability of the preventive maintenance operation.

Referring back to FIG. 3, if the preventive maintenance operation is determined to have been properly performed, a seasoning process may be performed on the chamber 10 (S400). The seasoning process may be a preliminary process, which is performed before a regular process on the substrate 12. During the seasoning process, a reaction gas may be supplied into the chamber 10. The seasoning process may be performed for about 4-48 hours. The plasma reaction 14 and the first reference plasma reaction may be sequentially or continuously performed. For example, the first optical test and the seasoning process may be sequentially or continuously performed.

Next, a second optical test may be performed (S500). The second optical test may be performed after the seasoning process. The second optical test S500 may be performed to optically examine results of the seasoning process. The second optical test S500 may be performed in the same manner as or a similar manner to the first optical test S200.

Figure 12:
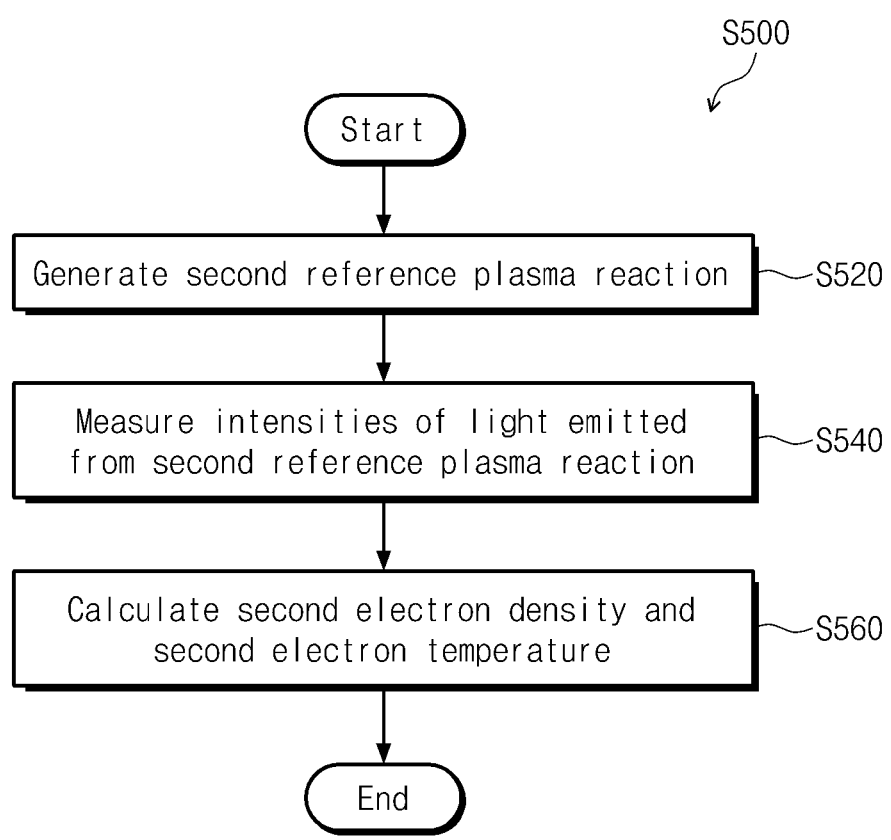
FIG. 12 is a flow chart illustrating an example of the second optical test of FIG. 3.

FIG. 12 is a flow chart illustrating an example of the second optical test S500 of FIG. 3.

Referring to FIG. 12, the second optical test S500 may include generating a second reference plasma reaction (S520), measuring intensities of light emitted from the second reference plasma reaction (S540), and calculating a second electron density and a second electron temperature (S560). An inactive gas, without a reaction gas, may be used in the second reference plasma reaction S520. In step S540, the control unit 80 may collect information on a variation of intensity by wavelength of the light emitted from the second reference plasma reaction. In step S560, the control unit 80 may calculate the second electron density and the second electron temperature. The second electron density and the second electron temperature may be obtained from an intensity ratio of the light emitted from the second reference plasma reaction. As an example, the second electron density and the second electron temperature may be calculated in the same manner as the first electron density and the first electron temperature, respectively.

Referring back to FIG. 3, the control unit 80 may determine whether the seasoning process is properly or improperly performed, based on the calculated values of the second electron density and the second electron temperature (S600). For example, in the case where the second electron density is within a third reference range and the second electron temperature is within a fourth reference range, the seasoning process may be determined to have been properly performed. In some embodiments, the third and fourth reference ranges may be the same as the first and second reference ranges 110 and 120, respectively. In other example embodiments, the third and fourth reference ranges may be different from the first and second reference ranges 110 and 120.

In the case where the second electron density and the second electron temperature are beyond the third and fourth reference ranges, the seasoning process may be determined to have been improperly performed. Each of the second electron density and the second electron temperature may be classified into a plurality of levels. For example, the second electron density may be classified into first to fourth levels L1-L4. The second electron temperature may be classified into fifth to seventh levels L5-L7.

The control unit 80 may control the display unit 90 to display a failure cause and a notification for a preventive maintenance operation, according to the first to seventh levels L1-L7 (S100). For example, in the case where the second electron density is classified as the first level L1, the control unit 80 may control the display unit 90 to display occurrence of a failure in vacuum level of the chamber 10. In the case where the second electron density is classified as the second level L2, the control unit 80 may control the display unit 90 to display occurrence of a failure in supplying an RF power. In the case where the second electron density is classified as the third level L3, the control unit 80 may control the display unit 90 to display occurrence of a failure in assembling the chamber 10. In the case where the second electron density is classified as the fourth level L4, the control unit 80 may control the display unit 90 to display occurrence of a failure in cleaning the chamber 10. In the case where the second electron temperature is classified as the fifth level L5, the control unit 80 may control the display unit 90 to display occurrence of particle contamination of the chamber 10. In the case where the second electron temperature is classified as the sixth level L6, the control unit 80 may control the display unit 90 to display occurrence of a failure in exhausting contaminants from the chamber 10. In the case where the second electron temperature is classified as the seventh level L7, the control unit 80 may control the display unit 90 to display occurrence of polymer contamination of the protection layer 23. To settle the corresponding failure cause, an operator may again perform a preventive maintenance operation.

If the seasoning process on the chamber 10 is determined to have been properly performed, a fabrication process may be performed in the chamber 10 (S700). The fabrication process may include an etching process. A bare wafer may be removed from the chamber 10, and the substrate 12 may be provided in the chamber 10 to perform a fabrication process.

A third optical test may be performed under the control of the control unit 80 (S800). In the third optical test S800, the results of the fabrication process may be examined using an optical method. The third optical test S800 may be periodically performed based on a cumulative operating time of the chamber 10. Alternatively, the third optical test S800 may be performed, when there is a failure of the fabrication process. The third optical test S800 may be performed in a similar manner to the first optical test S200.

Figure 13:
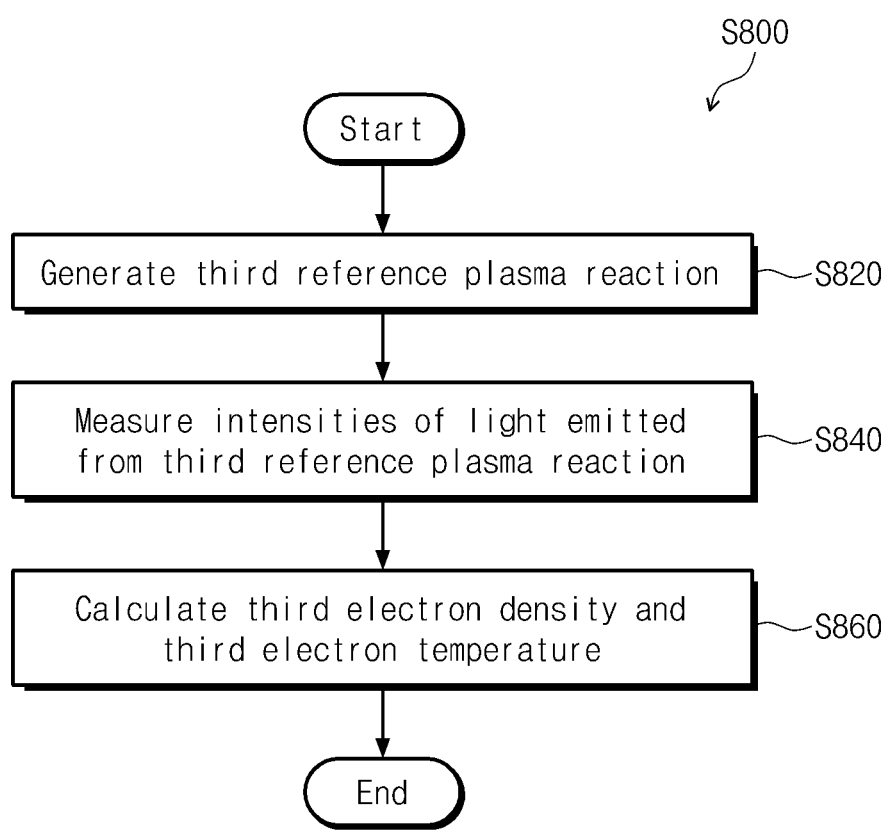
FIG. 13 is a flow chart illustrating an example of the third optical test of FIG. 3.

FIG. 13 is a flow chart illustrating an example of the third optical test S800 of FIG. 3.

Referring to FIG. 13, the third optical test S800 may include generating a third reference plasma reaction (S820), measuring intensities of light emitted from the third reference plasma reaction (S840), and calculating a third electron density and a third electron temperature (S860). An inactive gas, without a reaction gas, may be used in the third reference plasma reaction S820. In step S840, the control unit 80 may collect information on a variation of intensity by wavelength of the light emitted from the third reference plasma reaction. In step S860, the control unit 80 may calculate the third electron density and the third electron temperature. The third electron density and the third electron temperature may be obtained from an intensity ratio of the light emitted from the third reference plasma reaction. For example, the third electron density and the third electron temperature may be calculated in the same manner as the first electron density and the first electron temperature.

Referring back to FIG. 3, the control unit 80 may determine whether the fabrication process is properly or improperly performed, based on the calculated values of the third electron density and the third electron temperature (S900). For example, in the case where the third electron density is within a fifth reference range and the second electron temperature is within a sixth reference range, the fabrication process may be determined to have been properly performed. The fifth and sixth reference ranges may be the same as the first and second reference ranges 110 and 120, respectively. In other example embodiments, the fifth and sixth reference ranges may be different from the first and second reference ranges 110 and 120.

In the case where the third electron density and the third electron temperature are beyond the fifth and sixth reference ranges, the fabrication process may be determined to have been improperly performed. Each of the third electron density and the third electron temperature may be classified into a plurality of levels. The third electron density may be classified into the first to fourth levels L1-L4. The third electron temperature may be classified into the fifth to seventh levels L5-L7.

The control unit 80 may control the display unit 90 to display a failure cause and a notification for the preventive maintenance operation, according to the first to seventh levels L1-L7 (S100). In the case where the third electron density is classified as the first level L1, the control unit 80 may control the display unit 90 to display occurrence of a failure in vacuum level of the chamber 10. In the case where the third electron density is classified as the second level L2, the control unit 80 may control the display unit 90 to display occurrence of a failure in supplying an RF power. In the case where the third electron density is classified as the third level L3, the control unit 80 may control the display unit 90 to display occurrence of a failure in assembling the chamber 10. In the case where the third electron density is classified as the fourth level L4, the control unit 80 may control the display unit 90 to display occurrence of a failure in cleaning the chamber 10. In the case where the third electron temperature is classified as the fifth level L5, the control unit 80 may control the display unit 90 to display occurrence of particle contamination of the chamber 10. In the case where the third electron temperature is classified as the sixth level L6, the control unit 80 may control the display unit 90 to display occurrence of a failure in exhausting contaminants from the chamber 10. In the case where the third electron temperature is classified as the seventh level L7, the control unit 80 may control the display unit 90 to display occurrence of damage or polymer contamination of the protection layer 23. To settle the corresponding failure cause, an operator may again perform a preventive maintenance operation.

If the fabrication process is determined to have been properly performed, the control unit 80 may examine whether a preventive maintenance operation of the chamber 10 is needed (S1000). The preventive maintenance operation may be periodically performed, based on the cumulative operating time of the chamber 10. If the cumulative operating time of the preventive maintenance operation reaches a predetermined time period, the control unit 80 may control the display unit 90 to display the indicator for the preventive maintenance operation of the chamber 10 (S100). In other example embodiments, the preventive maintenance operation may be periodically performed, based on a cumulative lot number of the substrate 12 injected into the chamber 10. For example, the preventive maintenance operation may be periodically performed every cumulative operating time (e.g., of about 100-1000 hours) or every cumulative lot number of processed wafers (e.g., about 100-10000).

If it is early to perform the preventive maintenance operation, the control unit 80 may examine whether it is necessary to terminate the fabrication process (S1100). For example, if a process failure occurs, the fabrication process may be terminated. Otherwise, the fabrication process may be continuously performed under the control of the control unit 80 (S700).

Referring back to FIGS. 1 and 2, the host computer 200 may communicate with the control unit 80. For example, the host computer 200 may control the control unit 80 of each of the first to fifth substrate processing systems 101-105 to perform the first optical test and examine whether or not a failure associated with the preventive maintenance operation occurs. In certain embodiments, control operations of the control unit 80 may be performed by the host computer 200. Under the control of the host computer 200, the first optical test may be performed to examine whether there is a failure in the preventive maintenance operation performed on at least one of the first to fifth substrate processing systems 101-105 or to examine whether the preventive maintenance operation is properly or improperly performed. The host computer 200 may collect information on the first electron density and the first electron temperature. In the host computer 200, the first electron density and the first electron temperature may be respectively compared with the first and second reference ranges to determine whether the preventive maintenance operation is properly or improperly performed. In certain embodiments, the comparison may be performed in the host computer 200 in such a way that the first electron densities and the first electron temperatures of the first to fifth substrate processing systems 101-105 are compared with each other. In some cases, one or more of the first electron densities and the first electron temperatures may be excessively higher than its mean value. Then, the host computer 200 may interpret that the corresponding preventive maintenance operation is improperly performed. Furthermore, under the control of the host computer 200, the display unit 90 of the corresponding substrate processing system may display an occurrence of a failure in the corresponding preventive maintenance operation.

According to example embodiments of the inventive concept, a substrate processing system may include a control unit configured to perform an optical test on a chamber after a preventive maintenance operation, to calculate an electron density and an electron temperature from the optical test, to compare the electron density and the electron temperature with first and second reference ranges, respectively, and to determine whether the preventive maintenance operation is performed properly or improperly, from the comparison. If the electron density and the electron temperature are beyond the first and second reference ranges, respectively, the control unit may classify each of the electron density and the electron temperature into a plurality of levels based on its magnitude and display possible causes resulting in failures of the preventive maintenance operation, according to the classified levels.

While example embodiments of the inventive concepts have been particularly shown and described, it will be understood by one of ordinary skill in the art that variations in form and detail may be made therein without departing from the spirit and scope of the attached claims.

What is claimed is:

1. A method comprising:
    displaying an indication for a preventive maintenance operation on a chamber of a substrate processing system;
    performing a preventive maintenance operation on the chamber;
    performing a first optical test after the preventive maintenance operation is finished;
    determining whether the preventive maintenance operation for the chamber has been performed to achieve a predetermined condition, based on results of the first optical test; and
    performing a fabrication of a substrate to form a pattern or a layer with the substrate,
    wherein the performing of the first optical test comprises:
    generating a plasma reaction in the chamber;
    measuring a variation of intensity by wavelength for plasma light emitted from the plasma reaction; and
    calculating an electron density and an electron temperature from a ratio in intensity of the plasma light,
    wherein the determining further comprises comparing the electron density with a first reference range;
    wherein the preventive maintenance operation is determined to have been performed on the chamber to achieve the predetermined condition, when the electron density is in the first reference range; and
    wherein the first reference range is from $3 \times 10^{10}$ EA/cm$^3$ to $3 \times 10^{11}$ EA/cm$^3$.

2. The method of claim 1, wherein the determining further comprises:
    comparing the electron temperature with a second reference range;
    classifying each of the electron density and the electron temperature into a plurality of levels based on its magnitude, when the preventive maintenance operation is determined to have been performed for the chamber to have failed to achieve the predetermined condition; and
    displaying a cause resulting in a failure of the preventive maintenance operation, based on the classified level.

3. The method of claim 2, wherein
    the electron density is classified into a first level, when the electron density ranges from $3 \times 10^{11}$ EA/cm$^3$ to $3 \times 10^{12}$ EA/cm$^3$,
    the electron density is classified into a second level, when the electron density ranges from $3 \times 10^{12}$ EA/cm$^3$ to $3 \times 10^{13}$ EA/cm$^3$,
    the electron density is classified into a third level, when the electron density ranges from $3 \times 10^{13}$ EA/cm$^3$ to $3 \times 10^{14}$ EA/cm$^3$, and
    the electron density is classified into a fourth level, when the electron density is higher than $3 \times 10^{14}$ EA/cm$^3$.

4. The method of claim 3, wherein the displaying of the cause comprises displaying occurrence of a failure in vacuum level of the chamber, when the electron density is classified as the first level.

5. The method of claim 3, wherein the displaying of the cause comprises displaying occurrence of a failure in an RF power supplying part connected to the chamber, when the electron density is classified as the second level.

6. The method of claim 3, wherein the displaying of the cause comprises displaying occurrence of a failure in assembling the chamber, when the electron density is classified as the third level.

7. The method of claim 3, wherein the displaying of the cause comprises displaying occurrence of a failure in a wet cleaning process performed on the chamber, when the electron density is classified as the fourth level.

8. The method of claim 2, wherein the second reference range is from 1.5eV to 3eV,
    the electron temperature is classified into a first level, when the electron temperature ranges from 3eV to 4.5eV,
    the electron temperature is classified into a second level, when the electron temperature ranges from 4.5eV to 6eV, and
    the electron temperature is classified into a third level, when the electron temperature is higher than 6eV.

9. The method of claim 8, wherein the displaying of the cause comprises displaying occurrence of particle contamination on an inner wall of the chamber, when the electron temperature is classified as the first level.

10. The method of claim 8, wherein the displaying of the cause comprises displaying occurrence of a failure in exhausting contaminants from the chamber, when the electron temperature is classified as the second level.

11. The method of claim 8, wherein the displaying of the cause comprises displaying occurrence of a failure associated with a protection layer provided in the chamber, when the electron temperature is classified as the third level.

12. The method of claim 1, further comprising:
    performing a seasoning process on the chamber, when the preventive maintenance operation results in achieving the predetermined condition;
    performing a second optical test, after the seasoning process; and
    determining whether the seasoning process has been properly performed, based on results of the second optical test.

13. The method of claim 12, wherein the fabrication of the substrate is performed when the seasoning process is determined to have been properly performed, and
    the method further comprising:
    performing a third optical test, after the fabrication for the substrate; and
    determining whether the fabrication has been properly performed, based on results of the third optical test.

14. A method of manufacturing a semiconductor device, the method comprising:
    performing a preventive maintenance operation of the chamber;
    performing a first optical test after the preventive maintenance operation is finished;
    determining whether the preventive maintenance operation is performed for the chamber to be in compliance with a first predetermined condition, based on results of the first optical test; and
    performing a fabrication of a substrate to form a pattern or a layer with the substrate,
    wherein the performing of the first optical test comprises:
    generating a first plasma reaction in the chamber;
    measuring a variation of intensity by wavelength for plasma light emitted from the first plasma reaction; and
    calculating a first electron density and a first electron temperature from a ratio in intensity of the plasma light of the first plasma reaction, wherein the determining further comprises comparing the electron density with a first reference range;

wherein the preventive maintenance operation is determined to have been performed on the chamber to achieve the first predetermined condition, when the electron density is in the first reference range; and wherein the first reference range is from $3\times10^{10}$ EA/cm$^3$ to $3\times10^{11}$ EA/cm$^3$.

15. The method of claim 14, further comprising:

performing a seasoning process on the chamber, when the preventive maintenance operation is determined to have been performed for the chamber to be in compliance with the first predetermined condition;

performing a second optical test, after the performing the seasoning process; and determining whether the seasoning process is performed for the chamber to be in compliance with a second predetermined condition, based on results of the second optical test.

16. The method of claim 15, wherein the first predetermined condition and the second predetermined condition are substantially the same.

17. The method of claim 15, wherein the second optical test comprises:

generating a second plasma reaction in the chamber;

measuring a variation of intensity by wavelength for plasma light emitted from the second plasma reaction; and calculating a second electron density and a second electron temperature from a ratio in intensity of the plasma light of the second plasma reaction.

18. The method of claim 15, further comprising:

performing a third optical test, after the performing the fabrication of the substrate; and determining whether the fabrication is performed in a manner that results in compliance with a third predetermined condition, based on results of the third optical test, wherein the fabrication of the substrate is performed when the seasoning process has been performed for the chamber to result in compliance with the second predetermined condition.

19. The method of claim 18, wherein the second predetermined condition and the third predetermined condition are substantially the same.

20. The method of claim 18, wherein the third optical test comprises:

generating a third plasma reaction in the chamber;

measuring a variation of intensity by wavelength for plasma light emitted from the third plasma reaction; and calculating a third electron density and a third electron temperature from a ratio in intensity of the plasma light of the third plasma reaction.

* * * * *